United States Patent [19]

Malchow

[11] 4,334,198

[45] Jun. 8, 1982

[54] BIASING OF TRANSISTOR AMPLIFIER CASCADES

[75] Inventor: Max E. Malchow, Raritan Township, Hunterdon County, N.J.

[73] Assignee: RCA Corporation, New York, N.Y.

[21] Appl. No.: 143,504

[22] Filed: Apr. 24, 1980

[51] Int. Cl.$^3$ ............................................. H03F 3/04
[52] U.S. Cl. ................................... 330/296; 330/288; 323/315
[58] Field of Search ...................... 330/288, 295, 296; 323/315

[56] References Cited

U.S. PATENT DOCUMENTS

| | | | |
|---|---|---|---|
| 3,364,434 | 1/1968 | Widlar | 330/22 |
| 3,531,730 | 9/1970 | Steckler | 330/24 |
| 3,534,279 | 10/1970 | Limberg | 330/22 |
| 3,835,410 | 9/1974 | Wittlinger | 330/19 |
| 3,868,581 | 2/1975 | Ahmed | 330/19 |
| 3,906,386 | 9/1975 | Hongu et al. | 330/296 |

Primary Examiner—James B. Mullins
Assistant Examiner—Gene Wan
Attorney, Agent, or Firm—Eugene M. Whitacre; Paul J. Rasmussen; Allen LeRoy Limberg

[57] ABSTRACT

A common-collector-amplifier transistor is followed in direct-coupled cascade connection by a common-emitter amplifier transistor. A multiple-$V_{BE}$ supply biases the base of the common-collector-amplifier transistor respective to the emitter of the common-emitter amplifier, so the quiescent collector current of the common-emitter-amplifier transistor can be accurately defined. To improve the high-frequency response of the common-collector amplifier transistor, while preserving the capability of accurately defining the quiescent collector current of the common-emitter-amplifier transistor, the emitter of the common-collector amplifier transistor is supplied bias current from the collector of a constant-current-generator transistor having its emitter-to-base voltage related to that of one of the transistors in the multiple-$V_{BE}$ supply.

7 Claims, 5 Drawing Figures

BIASING OF TRANSISTOR AMPLIFIER CASCADES

The present invention relates to the biasing of direct-coupled cascade connections of the type having a common-collector-amplifier transistor followed by a common-emitter-amplifier transistor, as may be employed in monolithic integrated circuitry.

When such a cascade connection is operated at frequencies in the 10 MHz range, the frequency response of the cascade connection is poor unless the common-collector-amplifier transistor is arranged to have substantial quiescent emitter current—e.g., in the 0.5 mA range. In these cascades it is normal practice to operate the common-emitter amplifier stage with no emitter degeneration or with emitter degeneration provided solely by one or more forward-biased semiconductor diode means, and to use a multiple-$V_{BE}$ supply to bias the base of the common-collector-amplifier transistor respective to the emitter of the common-emitter-amplifier transistor. ($V_{BE}$ is the offset voltage associated with the forward-biased emitter-base junction of a transistor.)

This multiple-$V_{BE}$ supply includes at least a first regulator transistor provided with direct-coupled collector-to-base feedback to adjust its emitter-to-base voltage ($V_{BE}$) for conditioning it to conduct a prescribed level of current; and to provide the multiple-$V_{BE}$ voltage, its $V_{BE}$ may be augmented by a further transistor included in its collector-to-base feedback connection. Alternatively, the $V_{BE}$ of the first transistor may be augmented by that of a second regulator transistor provided with its own direct-coupled collector-to-base feedback connection to adjust to its $V_{BE}$ for conditioning it to conduct the prescribed level of current. Or the $V_{BE}$ of the first regulator transistor may be scaled up by multiplication—e.g., by the synthetic multiplication provided by a resistive potential divider inserted into its collector-to-base feedback connection.

Biasing the direct-coupled cascade connection of the common-collector-amplifier and common-emitter-amplifier transistors from the multiple-$V_{BE}$ supply is attractive in that it sets up the quiescent collector current of the common-emitter-amplifier stage in proportion to the prescribed level of current flowing through the first regulator transistor in the multiple-$V_{BE}$ supply. If one attempts to apply greater emitter bias current to the common-collector-amplifier transistor to improve its high frequency response, one is faced with the problem of introducing a variation into its $V_{BE}$ that will to some degree interfere with this attractive biasing relationship.

The present invention solves this problem by connecting the collector-to-emitter path of a constant-current generator transistor between the emitter of the common-collector transistor and the point of reference potential to which the emitter of the common-emitter amplifier transistor connects, and by applying between the emitter and base of the constant current generator transistor the emitter-to-base potential of one of the transistors in the multiple-$V_{BE}$ supply. This maintains tracking of the common-collector amplifier $V_{BE}$ with that of the first regulator transistor.

Figure 3:
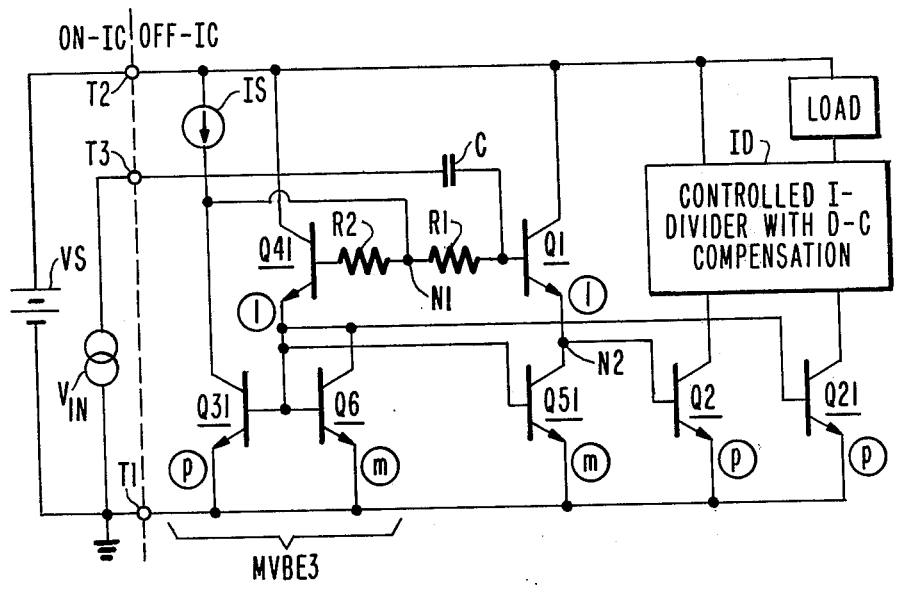
Figure 4:
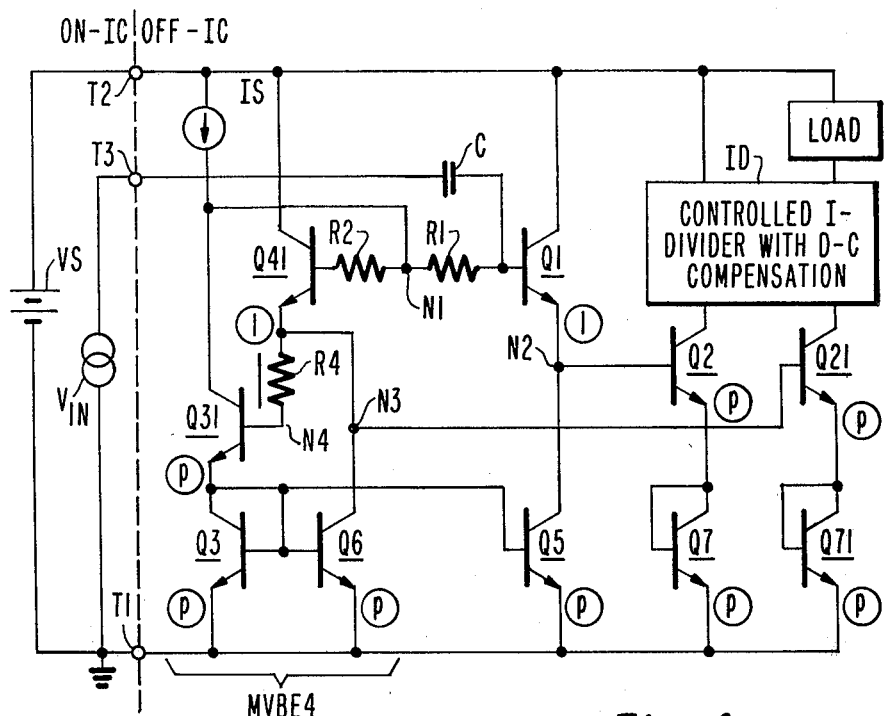
Figure 5:
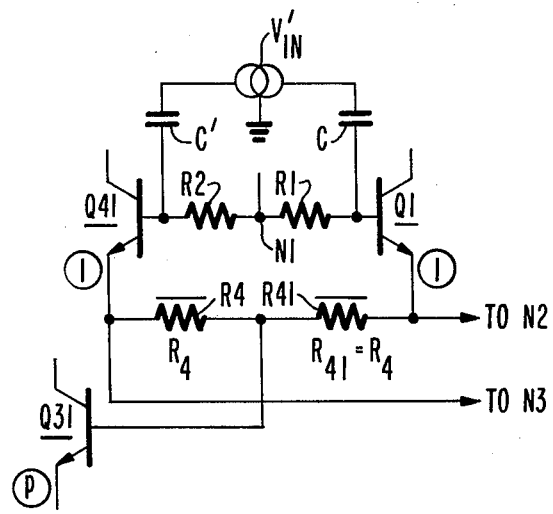

FIGS. 3 and 4 are schematic diagrams of circuitry embodying the present invention for biasing a direct-coupled transistor amplifier cascade and a further transistor for developing quiescent output equivalent to that supplied by the transistor amplifier cascade; and FIG. 5 is a schematic diagram of modifications to the FIG. 4 circuitry for cascade amplification of balanced input signals, resulting in a still further embodiment of the present invention.

Figure 1:
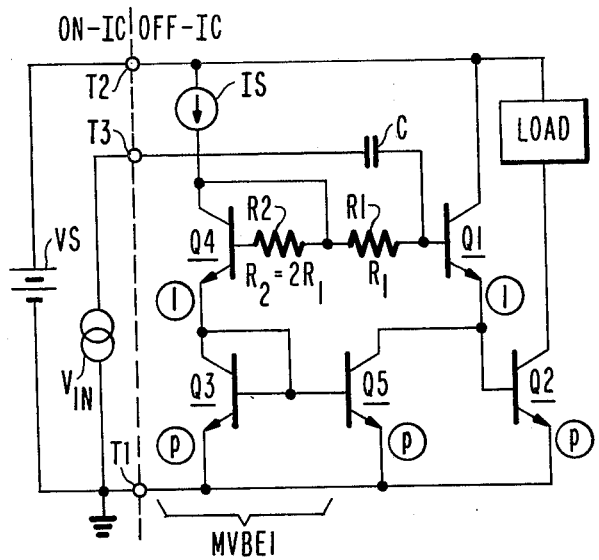
FIG. 1 is a schematic diagram of a direct-coupled cascade connection of transistor amplifier stages biased in accordance with the present invention.

In FIG. 1 a primary operating voltage supply VS applies a reference potential (shown as ground) to terminal T1 and an operating potential to terminal T2. A source VIN of input signal voltage is applied between terminals T1 and T3. A d-c blocking capacitor C permits the passage of input signal voltage variations from T3 to the base of an NPN common-collector-amplifier transistor Q1, the emitter of which is direct-coupled to the base of an NPN common-emitter-amplifier transistor Q2. In this cascade connection of Q1 and Q2, the emitter of Q2 is directly connected without emitter degeneration to terminal T1; and the base of Q1 receives base bias potential via resistor R1 from a multi-$V_{BE}$ supply MVBE1.

MVBE1 comprises the series connection of diode-connected NPN transistors Q3 and Q4, forward-biased by current from current source IS. IS may simply comprise a resistor, in addition to supply VS and diode-connected transistors Q3 and Q4; or IS may be provided by the emitter-to-collector path of a constant current generator transistor. Resistor R2 is included in the base connection of Q4 to provide a compensating voltage drop for that appearing across resistor R1, and R2 may be replaced by direct connection in applications where the quiescent collector level of Q2 need not be so closely controlled.

Of interest with respect to the present invention is NPN constant-current-generator transistor Q5, the collector-to-emitter path of which connects between the emitter of Q1 and terminal T1 to demand increased emitter current from Q1 for improving the high-frequency response of this common-collector amplifier transistor. Q5 is biased for constant-current generator operation by applying the emitter-to-base voltage $V_{BE3}$ of Q3 between the emitter and base of Q5 as its emitter-to-base voltage $V_{BE5}$.

Generally resistors R1 and R2 will have equal respective resistances $R_1$ and $R_2$; Q1, Q2, Q3, Q4 and Q5 will have similar diffusion profiles; and the effective areas of their respective emitter-base junctions will be in 1:p:1:p:p ratio as indicated by the encircled constants near their respective emitters, where p is a positive number usually unity or larger. Each of the transistors is assumed to operate at the same absolute temperature T as the other, to close approximation. Note, then, that Q3 and Q5 are connected as a current mirror amplifier with current gain of substantially unity amplitude, Q3 acting as the master mirroring transistor and Q5 as the slave mirroring transistor. So substantially the same emitter current flows in Q1 as in Q4; and by applying Kirchoff's Law of Voltages one can discern that the quiescent base potentials of Q2 and Q3 are therefore the same as each other's. Since the emitter potentials of Q2 and Q3 are also the same as each other's, and since the effective areas of their emitter-base junctions are the same, it follows that the quiescent collector current $I_{C2}$ of Q2 is the same as that of Q3 and is therefore defined by the current supplied by current source IS.

Figure 2:
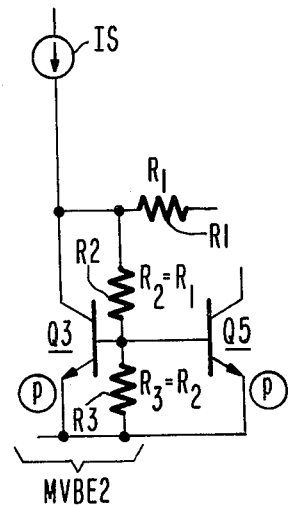
FIG. 2 is a schematic diagram of a modification that can be made to the FIG. 1 circuit, resulting in a further embodiment of the present invention.

FIG. 2 shows a modification of the FIG. 1 circuitry replacing MVBE1 with another multiple-$V_{BE}$ supply MVBE2 of the type in which $V_{BE3}$ is synthetically multiplied by two by inserting into its direct-coupled collector-to-base feedback a resistive potential divider, comprising resistors R2 and R3 having respective resistances $R_2$ and $R_3$ which are equal to each other and preferably to $R_1$.

FIG. 3 shows how to bias the direct-coupled cascade connection of Q1 and Q2 and how to bias a further grounded-emitter NPN transistor Q21 to have a quiescent collector current $I_{C21}$ the same as $I_{C2}$. Such an arrangement is useful, for example, when the collector current demand of Q2 is supplied as input to a controlled current divider ID, which requires as another input a current demand equal to $I_{C2}$. This $I_{C21}$ is required to compensate against d-c shift in the output current from the current divider ID to its load, as the factor by which the collector current of Q2 is divided is changed. Current divider ID typically comprises two long-tailed-pair connections of transistors, supplying the collector current demands of Q2 and Q21 as respective tail currents, having base inputs paired and directly paralleled for application of control voltage for controlling current division factor, and having collector outputs paired and cross-coupled, one pair returned to supply through the load and the other pair returned to supply directly.

The multiple-$V_{BE}$ supply MVBE3 comprises grounded-emitter NPN transistor Q31 with collector being conditioned by direct-coupled collector-to-base feedback to conduct substantially all the current supplied by current source IS. The collector-to-base feedback applied is via resistor R2 and the emitter-follower action of common-collector transistor Q41, Q41 being provided emitter loading by diode-connected NPN transistor Q6. The output voltage of MVBE3 to node N1 is the sum of the respective emitter-to-base voltage drops $V_{BE31}$ and $V_{BE41}$ of transistors 31 and 41 plus the relatively small compensating drop across R2.

Q6 can be considered to be the master mirroring transistor of a current mirror amplifier configuration having NPN transistors Q2, Q21, Q31 and Q51 as slave mirroring transistors. Q1, Q2, Q21, Q31, Q41, Q51 and Q6 are assumed to have similar diffusion profiles and to have respective effective emitter-base junction areas in 1:p:p:p:1:m:m ratio, m and p being positive numbers. Q51 is arranged to be the constant-current-generator transistor providing the primary quiescent emitter loading on common-collector-amplifier transistor Q1. Q51, as slave mirroring transistor, demands a collector current from the emitter of Q1 that is substantially equal to the emitter current that Q41 supplies to master mirroring transistor Q6, making the emitter potentials of Q41 and Q1 the same. Consequently, the base potential of Q2 is the same as those of Q31 and Q21. Since Q2, Q31 and Q21 have equal effective emitter-base junction areas, Q2 and Q21 will have quiescent collector currents $I_{C2}$ and $I_{C21}$ equal to the quiescent collector current $I_{C31}$ of Q31 as determined by the current supplied from current source IS. Note that this circuitry provides flexibility in choosing the collector current of the constant-current-generator transistor loading the emitter of Q1, allowing it to be chosen in any desired proportion to $I_{C2}$ rather than having to be equal to $I_{C2}$. This makes this approach of interest even where there is no need for Q21 and its quiescent collector current demand.

FIG. 4 shows a modification of the FIG. 3 circuitry in which the amplitude of the signal voltage common-emitter amplifier Q2 can accommodate at its base electrode is increased by inserting a diode-connected NPN transistor Q7 in the connection of the Q2 emitter to terminal T1 in such poling as to conduct the emitter current of Q2 in forward direction. This offsets the emitter of Q3 by $+V_{BE}$ from reference potential; and the emitters of Q31 and Q21 are correspondingly offset from reference potential by inserting diode-connected NPN transistors Q3 and Q71 in their respective emitter connections. The resulting multi-$V_{BE}$ supply MVBE4 supplies a voltage to node N1 one $V_{BE}$ greater than that applied by MVBE3, of course. As in the FIG. 1 circuitry, Q3 is in current mirror amplifier connection with a transistor Q5 providing a constant current load from its collector to the emitter of Q1. In FIG. 4 a diode-connected transistor Q6 is not used to degenerate the current gain of Q31. Instead, the undesirable tendency towards self-oscillation at still higher frequencies than those being amplified is suppressed by insertion of resistor R4 between the emitter of Q41 and base of Q31; preferably R4 is a doubly diffused resistor of the so-called "base pinch" type, so the small offset voltage it introduces does not vary with variation of the common-emitter forward current gain of Q31 during the course of mass manufacturing. The resistor symbol with adjacent bar is used to symbolize this type of transistor in the drawing.

FIG. 5 is a modification that can be made to the FIG. 4 circuitry to accommodate the replacement of single-ended source VIN of input signal with a balanced source VIN' of input signal applied via d-c blocking capacitors C and C' to the bases of Q1 and Q41 respectively. Resistors R4 and R41 with equal resistances $R_4$ and $R_{41}$ average the emitter voltages of common-collector-amplifier transistors Q1 and Q42 to supply their common-mode component to the base of Q31. Common-emitter amplifier transistors Q2 and Q21 respond to their respective base drives to supply balanced collector current variations to current divider ID to double the amplitude of the output signal it can deliver to its load. This circuitry can be further modified to provide balanced drive to Q2 and Q21 with emitters directly connected to terminal T1 by shifting diode-connected transistor Q7 to connect the emitter of Q1 to node N2 and by shifting diode-connected transistor Q71 to connect the emitter of Q41 to node N3.

One skilled in the art of electronic circuit design and armed with the foregoing disclosure will be able to make variations from the foregoing circuitry that are within the scope and spirit of the present invention; illustrations of such modifications follow. The input signal sources VIN and VIN', though illustrated as being external to an integrated circuit containing an embodiment of the invention, may in fact be a preceding amplifier stage in the same integrated circuit. Lateral-structure PNP transistors may be used rather than more conventional NPN vertical-structure transistors in constructing embodiments of the present invention. Emitter degeneration resistances relatively small compared to the internal emitter resistances may be inserted in the connections of the emitters of Q2, Q3 and Q5 in FIG. 1; Q31, Q6, Q51, Q2 and Q21 in FIG. 3; or Q3, Q6, Q5, Q2 and Q21 in FIG. 4. The common-collector-amplifier Q1 may have its collector disconnected from T2 and reconnected to the collector of Q2 to result in a Darlington cascade of those transistors.

What is claimed is:

1. A combination comprising:
   first, second and third transistors of the same conductivity type, each having respective base, emitter and collector electrodes;
   a first terminal for receiving a reference potential;
   a second terminal for receiving an operating potential to which the collector electrodes of said first and third transistors are connected;
   a third terminal for receiving an input signal;
   a capacitor connected between said third terminal and said first transistor base electrode;
   first resistive means with a first end connected to said first transistor base electrode and with a second end at a point of interconnection;
   galvanic connection means connecting said point of interconnection to the base electrode of said third transistor;
   current conductive means connected between said second terminal and said point of interconnection for conducting current of a first polarity to said point of interconnection to draw the potential thereat towards said operating potential;
   means for direct coupling said first transistor emitter electrode to said second transistor base electrode;
   means connecting said second transistor emitter electrode to said first terminal for referring the emitter potential of said second transistor to said reference potential;
   means responsive to the emitter potential of said third transistor exceeding a prescribed level for supplying first and second currents, of a second polarity and with amplitudes proportionally related to each other, to said point of interconnection and to said first transistor emitter electrode; and
   first load means to which said second transistor collector electrode is connected, including a path for quiescent current between that electrode and said second terminal.

2. A combination as set forth in claim 1 wherein
   said means responsive to the emitter potential of said third transistor exceeding a prescribed level to supply first and second currents includes
   means responsive to the emitter potential of said third transistor exceeding a prescribed level to supply to said third transistor emitter electrode a third current of said second polarity and with an amplitude proportionately related to that of said first and second currents; and wherein said galvanic connection means consists of
   second resistive means with a first end connected to said third transistor base and with a second end connected to said point of interconnection.

3. A combination as set forth in claim 2 wherein
   a fourth transistor of said same conductivity type has a base electrode to which the emitter electrode of said third transistor is direct coupled by means similar to the means for direct coupling said first transistor emitter electrode to said second transistor base electrode, has an emitter electrode connected to said first terminal by means for referring its emitter potential to said reference potential similarly to said second transistor emitter potential, and has a collector electrode; and wherein
   second load means is connected to said fourth transistor collector electrode and includes a path for quiescent current between that electrode and said second terminal.

4. A combination as set forth in claim 1, 2 or 3 wherein said means for supplying first and second currents comprises:
   a current mirror amplifier having an input connection from the emitter of said third transistor, having a first output connection from the emitter of said third transistor, having a first output connection to said point of interconnection, having a second output connection to the emitter electrode of said first transistor, and having a common connection to said first terminal.

5. A combination as set forth in claim 2 wherein said means for supplying first and second currents comprises:
   a fourth transistor of said same conductivity type having a collector electrode connected to said point of interconnection and having base and emitter electrodes;
   means for applying the emitter potential of said third transistor to the base electrode of said fourth transistor;
   fifth, sixth and seventh transistors of said same conductivity type having respective emitter electrodes connected to said first terminal, having respective base electrodes connected to the emitter electrode of said fourth transistor, and having respective collector electrodes respectively connected to the emitter electrode of said fourth transistor, to the emitter electrode of said first transistor and to the emitter electrode of said third transistor.

6. A combination as set forth in claim 5 wherein
   an eighth transistor of said same conductivity type has a base electrode to which the emitter electrode of said third transistor is direct coupled by means similar to the means for direct coupling said first transistor emitter electrode to said second transistor base electrode, has an emitter electrode connected to said first terminal by means for referring its emitter potential to said reference potential similarly to said third transistor emitter potential, and has a collector electrode; and wherein
   second load means is connected to said eighth transistor collector electrode and includes a path for quiescent current between that electrode and said second terminal.

7. A combination as set forth in claim 2 wherein said means for supplying first and second currents comprises:
   a fourth transistor of said same conductivity type having a collector electrode connected to said point of interconnection and having base and emitter electrodes;
   means for applying the average of the emitter potentials of said first and third transistor to the base electrode of said fourth transistor;
   fifth, sixth and seventh transistors of said same conductivity type having respective emitter electrodes connected to said first terminal, having respective base electrodes connected to the emitter electrode of said fourth transistor, and having respective collector electrodes respectively connected to the emitter electrode of said fourth transistor, to the emitter electrode of said first transistor and to the emitter electrode of said third transistor—and wherein there is additionally provided:

a fourth terminal for receiving a further input signal equal in amplitude and opposite in phase to the input signal applied to said third terminal;

means for applying balanced input signals to said third and fourth terminals;

a further capacitor connecting said fourth terminal and the base electrode of said third transistor;

an eighth transistor of said same conductivity type having a base electrode to which the emitter electrode of said third transistor is direct coupled by means similar to the means for direct coupling said first transistor emitter electrode to said second transistor base electrode, having an emitter electrode connected to said first terminal by means for referring its emitter potential to said reference potential similarly to said third transistor emitter potential, and having a collector electrode; and second load means connected to said fourth transistor collector electrode, including a path for quiescent current between that electrode and said second terminal.

* * * * *